United States Patent
Hwang et al.

(10) Patent No.: US 11,563,249 B2
(45) Date of Patent: Jan. 24, 2023

(54) BATTERY PACK SYSTEM INCLUDING MULTI-BATTERY

(71) Applicant: SK On Co., Ltd., Seoul (KR)

(72) Inventors: Kyu Min Hwang, Daejeon (KR); Jeong Min Seo, Daejeon (KR); Byung Eun Lee, Daejeon (KR); Chae Yoon Lee, Daejeon (KR)

(73) Assignee: SK On Co., Ltd., Seoul (KR)

( * ) Notice: Subject to any disclaimer, the term of this patent is extended or adjusted under 35 U.S.C. 154(b) by 205 days.

(21) Appl. No.: 16/867,963

(22) Filed: May 6, 2020

(65) Prior Publication Data
US 2020/0358059 A1    Nov. 12, 2020

(30) Foreign Application Priority Data
May 7, 2019    (KR) .................. 10-2019-0052866

(51) Int. Cl.
*H01M 50/20*    (2021.01)
*H01M 10/42*    (2006.01)
*G01R 31/392*    (2019.01)
*G01R 31/396*    (2019.01)

(52) U.S. Cl.
CPC .......... *H01M 50/20* (2021.01); *G01R 31/392* (2019.01); *G01R 31/396* (2019.01); *H01M 10/425* (2013.01); *H01M 2010/4278* (2013.01)

(58) Field of Classification Search
CPC . G01R 31/392; G01R 31/396; H01M 10/425; H01M 10/482; H01M 2010/4271; H01M 2010/4278; H01M 50/20; H01M 50/204; Y02E 60/10

See application file for complete search history.

(56) References Cited

U.S. PATENT DOCUMENTS

| | | |
|---|---|---|
| 10,124,694 B2 | 11/2018 | Yang et al. |
| 2007/0139006 A1 | 6/2007 | Yasuhito et al. |
| 2011/0129700 A1 | 6/2011 | Hong |
| 2017/0016961 A1 | 1/2017 | Lucea |

(Continued)

FOREIGN PATENT DOCUMENTS

| | | |
|---|---|---|
| KR | 19920001303 A | 1/1992 |
| KR | 100991084 B1 | 10/2010 |

(Continued)

*Primary Examiner* — Victoria H Lynch
(74) *Attorney, Agent, or Firm* — The Webb Law Firm

(57) ABSTRACT

The present invention relates to a battery pack system. In the battery pack system including a multi-battery according to the present invention, replacement may be easily performed in a lower unit of the battery pack system, the battery pack system including a multi-battery may include the battery modules having various forms and performances and capable of being arranged so as to increase space efficiency of the battery pack system, the battery pack system including a multi-battery includes the battery modules having various forms and performances, such that an energy density of the battery pack system may be improved, and the battery pack system including a multi-battery may allow battery modules having various performances and outputs to maintain states of charge (SOCs) (%) in a uniform ratio by estimating the SOCs of the respective battery modules and re-scaling the SOCs according to a capacity criterion of a control unit.

7 Claims, 6 Drawing Sheets

(56) References Cited

U.S. PATENT DOCUMENTS

2019/0190282 A1* 6/2019 Zheng .................. H01M 10/48
2019/0356143 A1* 11/2019 Lee .................. H01M 10/4285

FOREIGN PATENT DOCUMENTS

| KR | 101093935 B1 | 12/2011 |
| KR | 1020160130389 A | 11/2016 |
| KR | 101726927 B1 | 4/2017 |
| KR | 101889206 B1 | 8/2018 |

* cited by examiner

Prior Art

BATTERY PACK SYSTEM INCLUDING MULTI-BATTERY

CROSS-REFERENCE TO RELATED APPLICATION

This application claims priority to Korean Patent Application No. 10-2019-0052866 filed May 7, 2019, the disclosure of which is hereby incorporated by reference in its entirety.

TECHNICAL FIELD

The following disclosure relates to a battery pack system, and more particularly, to a battery pack system including batteries of various specifications.

BACKGROUND

In a case where some battery modules need to be replaced by new battery modules of the same battery due to a malfunction during using a battery pack according to the related art, a difference between capacities inevitably appears due to a difference in a lifespan between a new battery and an existing battery, and problems such as acceleration of deterioration of a lifespan and occurrence of various malfunction diagnosis codes may occur at the time of continuously using the battery pack. Therefore, the battery pack according to the related art has a problem that in a case where a defect occurs in some components of the battery pack, the entire battery pack needs to be replaced. Additionally, in such a situation, in a case where a battery configured in the battery pack is discontinued, it is not possible to supply a module to replace the battery, and it may thus be necessary to replace the battery pack by a battery pack including a replacement battery.

In order to solve the above problems, Korean Patent Registration No. 10-1889206 (entitled "Battery Management Device") (hereinafter referred to as the related art) has been disclosed. The related art will be briefly described with reference to FIG. 1. The related art includes a plurality of replaceable battery modules 130 managed by a battery pack management unit 102, and each of the plurality of replaceable battery modules 130 includes a battery cell package 125 and a battery management unit 101 managing the battery cell package 125. In a case of the related art, states of each of the battery cell packages may be individually grasped and controlled by providing means capable of measuring each of the battery cell packages 125 in the battery management units 101. However, the related art may be applied only in a case where all of the batteries in a battery pack have the same performance and form, and has a problem that an application example is limited.

In addition, the battery pack in which the batteries having the same performance and form as in the related art are mounted has an advantage that it is easy to control the battery pack, but has a disadvantage that space unitization is low at the time of configuring the battery pack since the forms of the batteries are the same as each other. In order to overcome such a disadvantage, the battery modules have been arranged in different configurations, but there is a clear limitation because forms of individual battery cells are fixed.

RELATED ART DOCUMENT

Patent Document

Korean Patent Registration No. 10-1889206 (entitled "Battery Management Device")

SUMMARY

An embodiment of the present invention is directed to providing a battery pack system including a multi-battery in which replacement may be easily performed in a lower unit of the battery pack system, that is, a battery module unit.

Further, an embodiment of the present invention is directed to providing a battery pack system including a multi-battery that includes battery modules having various forms and performances and capable of being arranged so as to increase space efficiency of the battery pack system.

Further, an embodiment of the present invention is directed to providing a battery pack system including a multi-battery that includes battery modules having various forms and performances, such that an energy density of the battery pack system is improved.

Further, an embodiment of the present invention is directed to providing a battery pack system including a multi-battery capable of allowing battery modules having various performances and outputs to maintain states of charge (SOCs) (%) in a uniform ratio by estimating the SOCs of the respective battery modules and re-scaling the SOCs according to a capacity criterion of a control unit.

In one general aspect, a battery pack system including a multi-battery includes: a plurality of battery cells; a plurality of battery modules including the plurality of battery cells; and a control unit acquiring information from the plurality of battery modules to balance the plurality of battery modules.

At least any one of capacities, forms, and lifespans of some of the plurality of battery modules may be different from each other.

The control unit may include a plurality of module control units corresponding to the battery modules in a one-to-one manner and acquiring information from the respective battery modules to control the respective battery modules, and a central control unit receiving information from the module control units to control the module control units.

The module control units may store capacity information of battery cells applied to the battery modules corresponding thereto.

The central control unit may set a minimum capacity value of capacity values of the battery modules as a representative capacity.

Each of the module control units may estimate a state of charge (SOC) of the corresponding battery module rather than a battery module whose capacity is set to the representative capacity, derive a capacity difference between the battery module and the battery module whose capacity is set to the representative capacity to estimate a capacity ratio, and re-scale the SOC of each battery module according to the capacity ratio on the basis of the representative capacity and transmit the re-scaled SOC to the central control unit.

The central control unit may balance the respective battery modules so that the re-scaled SOCs of the respective battery modules are maintained to be the same as each other.

The respective module control units may estimate available outputs of the corresponding battery modules and transmit the available outputs to the central control unit, and the central control unit may set a minimum value of the transmitted available outputs as a representative output.

The battery pack system including a multi-battery may be designed so that a user easily changes an arrangement of the respective battery modules according to use.

DETAILED DESCRIPTION OF EMBODIMENTS

Hereinafter, the technical spirit of the present invention will be described in more detail with reference to the accompanying drawings. Terms and words used in the present specification and claims are not to be construed as a general or dictionary meaning, but are to be construed as meaning and concepts meeting the technical ideas of the present invention based on a principle that the present inventors may appropriately define the concepts of terms in order to describe their inventions in best mode.

Therefore, configurations described in exemplary embodiments and drawings of the present invention are merely the most preferable embodiments and do not represent all of the technical spirit of the present invention. Therefore, it is to be understood that there are various modification that may substitute for configurations according to the present invention at the time of filing the present application.

Hereinafter, the technical spirit of the present invention will be described in more detail with reference to the accompanying drawings. The accompanying drawings are only examples illustrated in order to describe the technical idea of the present invention in more detail. Therefore, the technical idea of the present invention is not limited to forms of the accompanying drawings.

Figure 1:
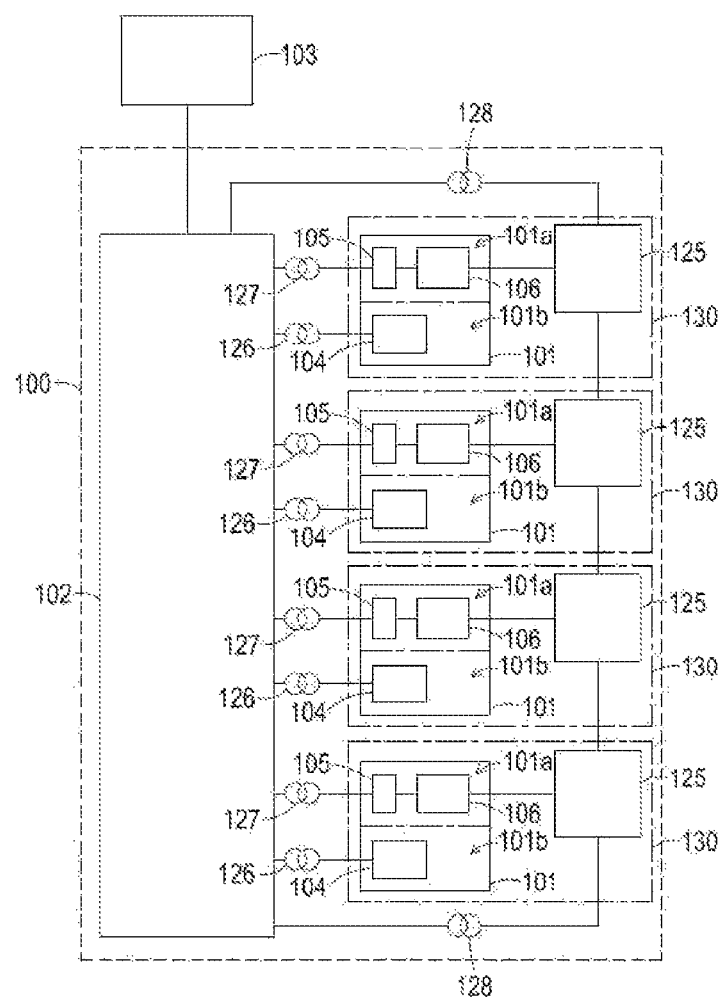
FIG. 1 is a schematic view illustrating a battery pack system according to the related art.
Figure 2:
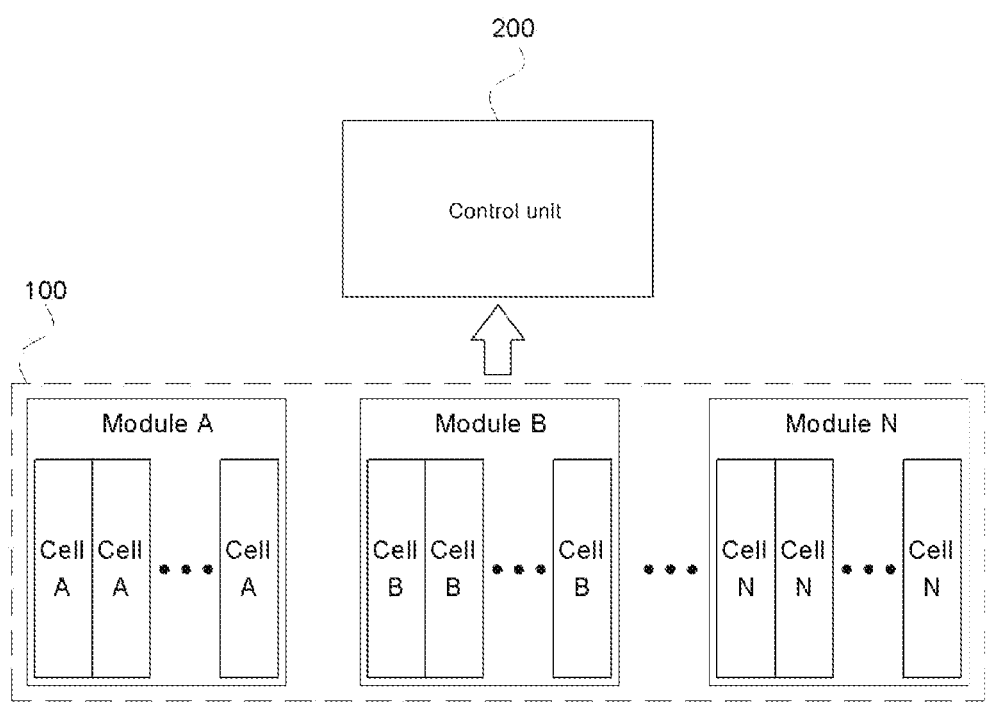
FIG. 2 is a schematic view illustrating a relationship between a battery module and a control unit of the present invention.

Hereinafter, a schematic configuration of a battery pack system including a multi-battery will be described with reference to FIG. 2.

A battery pack system including a multi-battery according to the present invention may include a plurality of battery cells and a plurality of battery modules 100 each including the plurality of battery cells. The plurality of battery modules 100 may be individually managed in the battery pack system. In addition, the battery pack system including a multi-battery according to the present invention may include a control unit 200 acquiring information from the plurality of battery modules 100 to balance the plurality of battery modules. The control unit 200 preferably stores basic specification information of the plurality of battery modules 100, and may estimate current charging and discharging states of the plurality of battery modules 100 on the basis of the specification information.

In addition, at least any one of capacities, forms, and lifespans of some of the plurality of battery modules 100 of the battery pack system including a multi-battery according to the present invention may be different from each other. In addition, it is preferable that the battery pack system including a multi-battery is designed so that a user may easily change an arrangement of each battery module 100 according to an application. Therefore, the battery pack system including a multi-battery according to the present invention may include the plurality of battery modules 100 having various specifications, such that an energy density may be improved and efficiency of a space inside the battery pack system may be improved.

Figure 3:
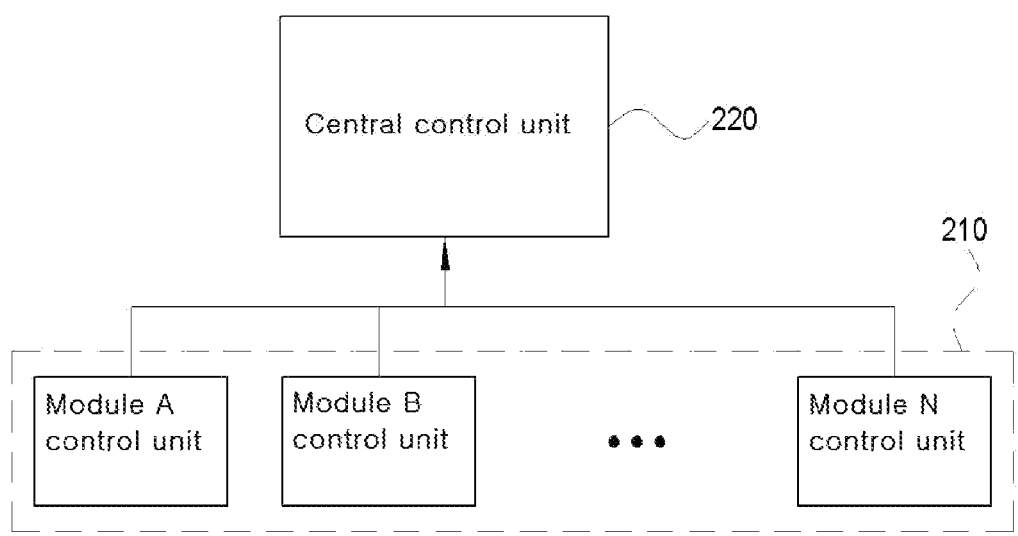
FIG. 3 is a schematic view illustrating components of the control unit according to the present invention and operations of the components.

Hereinafter, components of the control unit 200 according to the present invention and roles of the respective components will be described with reference to FIG. 3.

The control unit 200 may include a plurality of module control units 210 and a central control unit 220. The module control units 210 may correspond to the battery modules 100 in a one-to-one manner, and may acquire information from the respective battery modules 100 to control the respective battery modules 100. In addition, the central control unit 220 may receive information from the module control units 210 to control the module control units 210.

In more detail, it is preferable that the module control units 210 or the central control unit 220 stores capacity information of battery cells applied to the battery modules 100 corresponding thereto, and it is preferable that the central control unit 220 sets a minimum capacity value of the capacity values of the respective battery modules 100 as a representative capacity. The central control unit 220 may re-scale states of charge (SOCs) of the other battery modules 100 whose capacity is not set to the representative capacity on the basis of the set representative capacity (in a case where a connection between the battery modules 100 is a series connection).

Figure 4:
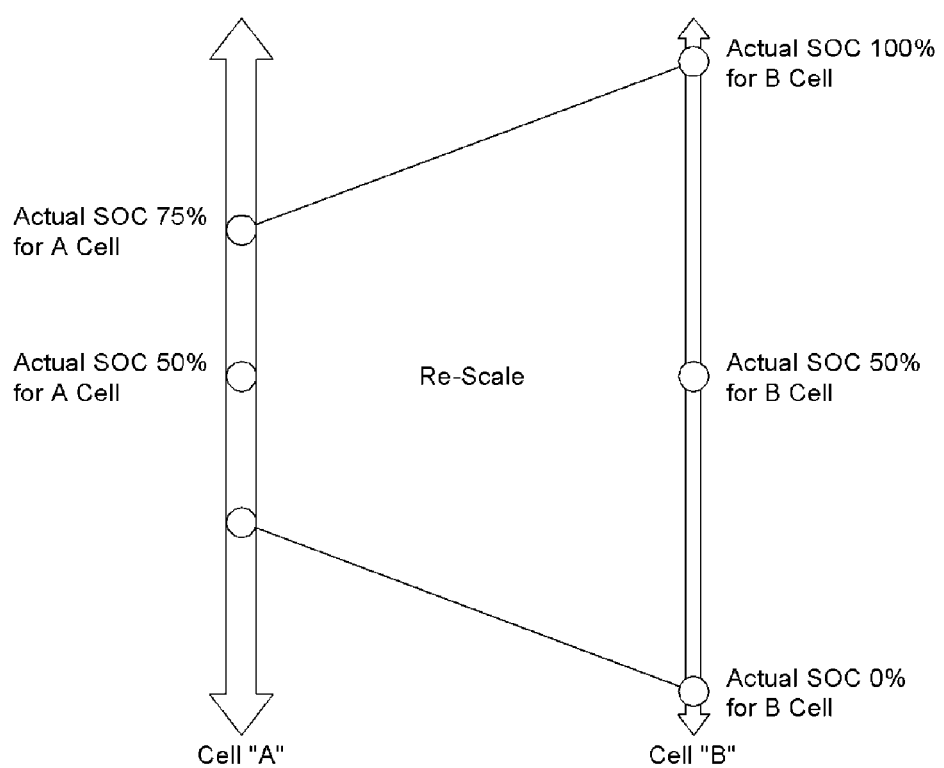
FIG. 4 is a conceptual diagram illustrating a state of charge (SOC) re-scaling manner according to the present invention.

Hereinafter, a control manner of the control unit 200 will be described in more detail with reference to FIG. 4. In the following control manner, it is assumed that the connection between the battery modules 100 is the series connection.

Each of the respective module control units 210 may estimate the SOC of the other battery module 100 rather than the battery module 100 whose capacity is set to the representative capacity and derive a capacity difference between the battery module and the battery module whose capacity is set to the representative capacity to estimate a capacity ratio x. Therefore, the module control unit 210 may re-scale the SOC of each battery module 100 according to the capacity ratio on the basis of the representative capacity, and transmit the re-scaled SOC al to the central control unit 220. As illustrated in FIG. 4, at the time of charging and discharging the battery module, the SOC of the battery module may be re-scaled so that an upper limit value and a lower limit value of the SOC are symmetrical to each other around 50% of the SOC. When one battery may be charged up to 100% and the other battery may be charged up to 80% in a state where one battery and the other battery are connected to each other in series, the SOC of the battery charged up to 80% is re-scaled so that the battery charged up to 80% is charged and discharged in a section of 10% to 90% of the SOC. However, the SOC of the battery module may be re-scaled on the basis of another SOC value according to a purpose, and may be re-scaled on the basis of a value less than 50% of the SOC in order to prevent overcharge.

In addition, the central control unit 220 may balance the respective battery modules 100 so that the re-scaled SOCs of the respective battery modules 100 are maintained to be the same as each other. A manner of balancing the respective battery modules 100 may be a manner of discharging an overcharged battery by connecting resistors to each other by a switch.

In the present disclosure, in addition to the case where the connection between the battery modules 100 is the series connection described in the above paragraph, an internal control manner of the battery pack system including a multi-battery in a case where the connection between the battery modules 100 is parallel connection will hereinafter be described. In the case where the connection between the battery modules 100 is the parallel connection, direct current (DC)/DC converters may be arranged in front of the respective battery modules 100. The DC/DC converters may be arranged to correspond to the respective battery modules 100 in a one-to-one manner, or may be arranged in front of some of the plurality of battery modules 100. Since the DC/DC converters are arranged as described above, the battery modules 100 of different specifications, having different outputs are standardized, such that the battery pack system may be smoothly operated even though it includes the multi-battery.

In addition, in the battery pack system including a multi-battery according to the present invention, the module control units 210 may estimate change amounts of the SOCs of the respective battery modules 100 from the plurality of battery modules 100 maintaining predetermined capacities through the method described above to diagnose states of health (SOHs) of the respective battery modules 100 according to the following Equation 1.

$$SOH = {}^{\Delta}A / {}^{\Delta}A'$$ Equation 1

Here, SOH is a state of health, $^{\Delta}A$ is a cumulative current amount within an SOC calculation cycle, and $^{\Delta}A'$ is a cumulative current amount within the SOH calculation cycle represented in an SOH of 100%.

When the amount of change in SOC is more than a certain value, the SOH value can be updated.

In addition, in the battery pack system including a multi-battery according to the present invention, the respective module control units 210 may estimate the change amounts of the SOCs of the respective battery modules 100 from the plurality of battery modules 100 maintaining the predetermined capacities through the method described above to estimate available outputs of the corresponding battery modules 100, and transmit the available outputs to the central control unit 220, and the central control unit 220 may set a minimum value of the transmitted available outputs as a representative output. A maximum available output of the battery pack system may be estimated on the basis of the representative output set as described above, and a phenomenon in which an overload is applied to a specific battery module may thus be reduced.

Hereinafter, exemplary embodiments of a control form of a battery pack system including a multi-battery will be described with reference to FIGS. 5 and 6.

Figure 5:
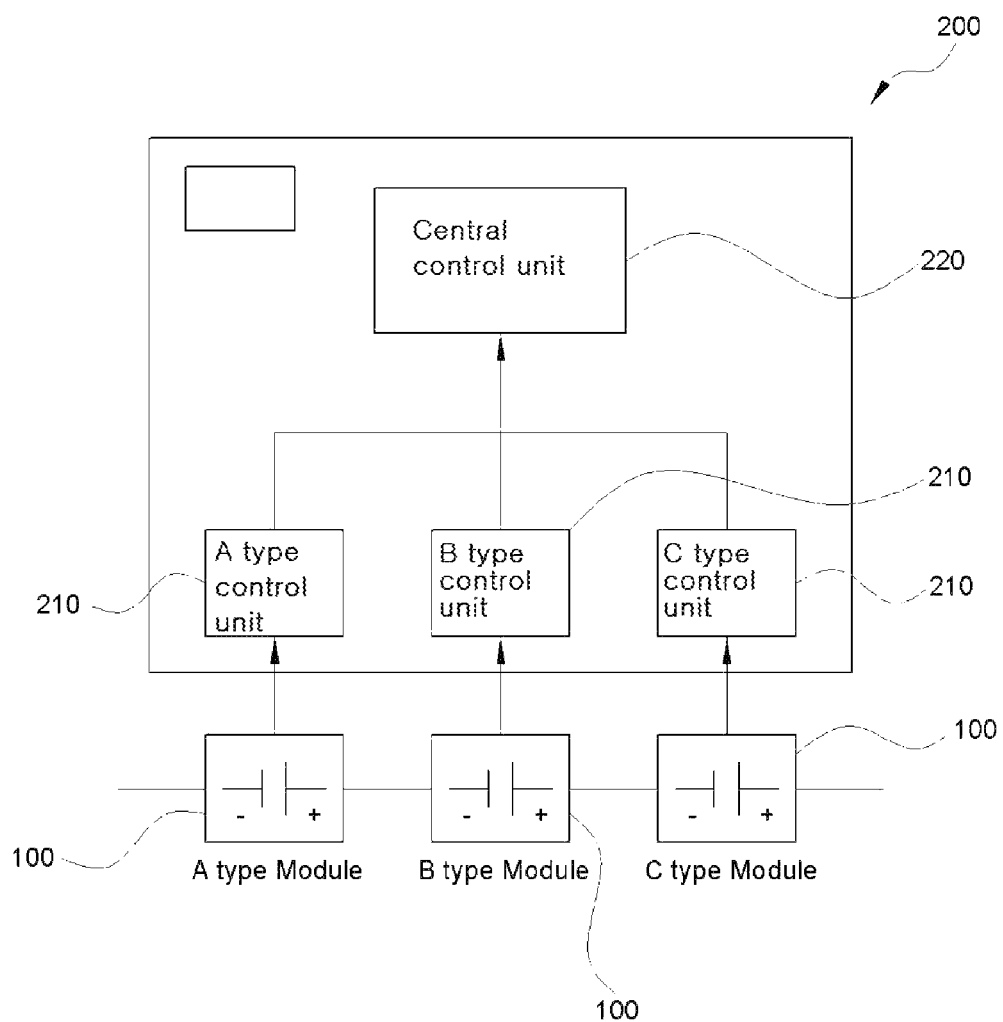
FIG. 5 is a schematic view illustrating a first exemplary embodiment of a control form according to the present invention.
Figure 6:
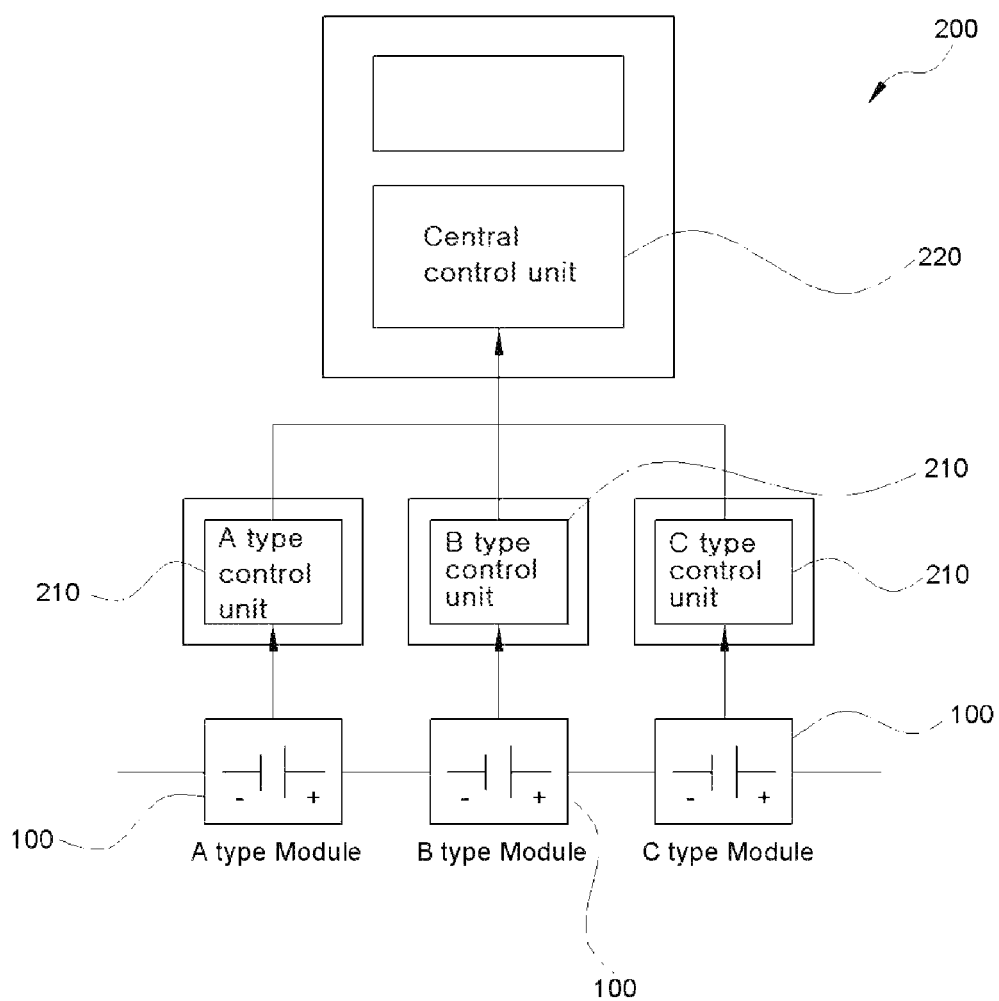
FIG. 6 is a schematic view illustrating a second exemplary embodiment of a control form according to the present invention.

A battery pack system including a multi-battery illustrated in FIG. 5 is a schematic view illustrating a first exemplary embodiment of the present invention in which a control unit 200 is connected in an integrated type, and a battery pack system including a multi-battery illustrated in FIG. 6 is a second exemplary embodiment of the present invention in which a control unit 200 is connected in a distributed type. A convenient control manner of control manners according to the first exemplary embodiment and the second exemplary embodiment may be selected according to convenience of the user.

Hereinabove, although the present invention has been described by specific matters such as detailed components, exemplary embodiments, and the accompanying drawings, they have been provided only for assisting in the entire understanding of the present invention. Therefore, the present invention is not limited to the exemplary embodiments. Various modifications and changes may be made by those skilled in the art to which the present invention pertains from this description.

Therefore, the spirit of the present invention should not be limited to these exemplary embodiments, but the claims and all of modifications equal or equivalent to the claims are intended to fall within the scope and spirit of the present invention.

In the battery pack system including a multi-battery according to the present invention having the configuration as described above, replacement may be easily performed in a lower unit of the battery pack system, that is, a battery module unit.

In addition, the battery pack system including a multi-battery may include the battery modules having various forms and performances and capable of being arranged so as to increase space efficiency of the battery pack system.

Further, the battery pack system including a multi-battery includes the battery modules having various forms and performances, such that an energy density of the battery pack system may be improved.

Furthermore, the battery pack system including a multi-battery may allow battery modules having various performances and outputs to maintain SOCs (%) in a uniform ratio by estimating the SOCs of the respective battery modules and re-scaling the SOCs according to a capacity criterion of a control unit.

DETAILED DESCRIPTION OF MAIN ELEMENTS

100: battery module
200: control unit
210: module control unit
220: central control unit

What is claimed is:

1. A battery pack system including a multi-battery, comprising:
   a plurality of battery cells;
   a plurality of battery modules including the plurality of battery cells; and
   a control unit acquiring information from the plurality of battery modules to balance the plurality of battery modules,
   wherein at least any one of capacities, forms, or lifespans of at least any one of the plurality of battery modules are different from each other, and
   the control unit:
   sets a minimum capacity value of the respective capacity values of the plurality of battery modules as a representative capacity,
   estimates a state of charge (SOC) of the any other plurality of battery modules rather than a battery module whose capacity is set to the representative capacity,
   re-scales the SOC of each battery module according to a capacity ratio on a basis of the representative capacity, and
   calculates the re-scaled SOC.

2. The battery pack system including a multi-battery of claim 1, wherein the control unit includes a plurality of module control units corresponding to the plurality of battery modules in a one-to-one manner and acquires information from the respective plurality of battery modules to control the respective plurality of battery modules, and a central control unit receives information from the plurality of module control units to control the plurality of module control units.

3. The battery pack system including a multi-battery of claim 2, wherein the plurality of module control units store capacity information of battery cells applied to the plurality of battery modules corresponding thereto.

4. The battery pack system including a multi-battery of claim 3, wherein the respective plurality of module control units estimate available outputs of the corresponding plurality of battery modules and transmit the available outputs to the central control unit, and the central control unit sets a minimum value of the transmitted available outputs as a representative output.

5. The battery pack system including a multi-battery of claim 2, wherein each of the plurality of module control units:

estimates a state of charge (SOC) of a corresponding battery module, derives a capacity difference between the battery module and the corresponding battery module whose capacity is set to the representative capacity to estimate the capacity ratio, and re-scales the capacity ratio for the SOC estimated on the basis of the representative capacity and transmits the re-scaled SOC to the central control unit.

6. The battery pack system including a multi-battery of claim 5, wherein the central control unit balances the respective plurality of battery modules so that the re-scaled SOCs of the respective plurality of battery modules are maintained to be the same as each other.

7. The battery pack system including a multi-battery of claim 1, wherein the battery pack system including the multi-battery is designed so that a user easily changes an arrangement of the respective plurality of battery modules according to use.

* * * * *